(12) United States Patent
Zhao

(10) Patent No.: US 10,573,669 B2
(45) Date of Patent: Feb. 25, 2020

(54) METHOD FOR FABRICATING ARRAY SUBSTRATE, ARRAY SUBSTRATE, AND DISPLAY DEVICE

(71) Applicant: BOE TECHNOLOGY GROUP CO., LTD., Beijing (CN)

(72) Inventor: Meng Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/106,064

(22) Filed: Aug. 21, 2018

(65) Prior Publication Data

US 2019/0189648 A1 Jun. 20, 2019

(30) Foreign Application Priority Data

Dec. 14, 2017 (CN) .......................... 2017 1 1338767

(51) Int. Cl.
*H01L 27/12* (2006.01)
*H01L 21/02* (2006.01)
(Continued)

(52) U.S. Cl.
CPC ........ *H01L 27/1262* (2013.01); *G06F 3/0412* (2013.01); *H01L 21/02126* (2013.01); *H01L 21/02164* (2013.01); *H01L 21/32051* (2013.01); *H01L 21/32136* (2013.01); *H01L 27/124* (2013.01); *H01L 27/1222* (2013.01); *H01L 29/78633* (2013.01); *H01L 29/78672* (2013.01); *G06F 3/044* (2013.01); *G06K 9/0002* (2013.01); *H01L 27/323* (2013.01);
(Continued)

(58) Field of Classification Search
CPC ......... H01L 21/02126; H01L 21/02164; H01L 21/32051; H01L 21/32136; H01L 27/1262; H01L 27/1222; H01L 27/124; H01L 29/78633; H01L 29/78672
See application file for complete search history.

(56) References Cited

U.S. PATENT DOCUMENTS

2008/0087633 A1* 4/2008 Oh ............................ C23F 1/12
216/41
2010/0200999 A1* 8/2010 Yamazaki ........... H01L 23/5222
257/774
(Continued)

FOREIGN PATENT DOCUMENTS

CN 104681629 A 6/2015
CN 106920820 A 7/2017

OTHER PUBLICATIONS

First Office Action for Chinese Patent Application No. 201711338767.5 dated Nov. 25, 2019.

*Primary Examiner* — Mark W Tornow
(74) *Attorney, Agent, or Firm* — Calfee, Halter & Griswold LLP

(57) ABSTRACT

A method for fabricating an array substrate includes: forming a first metal layer on a base substrate; forming an insulating layer of a silicon-containing organic material on the first metal layer; forming a second metal layer on the insulating layer; patterning the second metal layer by adopting an oxygen ion etching process to partially cover the insulating layer; and forming a silicon oxide layer, by the oxygen ion etching process, on a surface of the insulating layer not covered by the second metal layer.

11 Claims, 3 Drawing Sheets

(51) Int. Cl.
*H01L 21/3205* (2006.01)
*H01L 21/3213* (2006.01)
*H01L 29/786* (2006.01)
*G06F 3/041* (2006.01)
*G06K 9/00* (2006.01)
*H01L 27/32* (2006.01)
*G06F 3/044* (2006.01)

(52) U.S. Cl.
CPC ...... *H01L 27/3234* (2013.01); *H01L 27/3262* (2013.01); *H01L 27/3272* (2013.01)

(56) References Cited

U.S. PATENT DOCUMENTS

| | | | |
|---|---|---|---|
| 2017/0018726 A1* | 1/2017 | Katsuhara | H01L 51/0017 |
| 2017/0117302 A1* | 4/2017 | Zhang | H01L 27/1225 |
| 2017/0194500 A1* | 7/2017 | Li | H01L 21/467 |

* cited by examiner

METHOD FOR FABRICATING ARRAY SUBSTRATE, ARRAY SUBSTRATE, AND DISPLAY DEVICE

CROSS-REFERENCE TO RELATED APPLICATIONS

The present application claims priority to Chinese Patent Application No. 201711338767.5, filed Dec. 14, 2017, and entitled "METHOD FOR FABRICATING ARRAY SUBSTRATE, ARRAY SUBSTRATE, AND DISPLAY DEVICE", the entire contents of which are incorporated herein by reference.

TECHNICAL FIELD

The present disclosure relates to the field of display technology, and more particularly, to a method for fabricating an array substrate, an array substrate, and a display device.

BACKGROUND

With the development of low temperature poly-silicon (LTPS) touch display panels, the requirements for production processes and designs are getting higher and higher. A process structure of two metal layers is increasingly applied to OLED backplane processes, that is to say, in order to improve pixels of the display panel, a metal layer, which includes a source, a drain, a source line, and a drain line, and a metal layer, which includes a functional layer in a display device, of a TFT array can be realized in a two-layer structure, and insulation is achieved by an insulating layer between the two metal layers. Further, a portion of metals in the two layers are electrically connected through a via hole formed in the insulating layer.

The insulating layer between the two metal layers is generally made of an inorganic layer such as silicon oxide or silicon nitride. The inorganic layer has the disadvantages of poor coverage and bendability, and the like, and is neither suitable for an OLED display device, nor for a flexible display device. The use of an organic material such as polyimide as a material for the insulating layer can overcome the above-described disadvantages of a conventional electrodeless insulating layer. However, a polyimide photoresist used in the conventional insulating layer is a polymer material based on a carbon chain structure, and when a metal layer formed on the insulating layer is required to be patterned, polyimide is easily etched in an oxygen ion etching process, this causes difficulties in the process, and may cause the formation of a recess on the metal layer on the insulating layer, even cause contact of the metal layer with the underlying metal layer, thereby destroying the insulation between the two metal layers, and affecting product quality.

It is to be noted that the above information disclosed in this Background section is only for enhancement of understanding of the background of the present disclosure and therefore it may contain information that does not form the prior art that is already known to a person of ordinary skill in the art.

SUMMARY

According to a first aspect of the present disclosure, a method for fabricating an array substrate is provided, including:

forming a first metal layer on a base substrate;

forming an insulating layer of a silicon-containing organic material on the first metal layer;

forming a second metal layer on the insulating layer;

patterning the second metal layer by adopting an oxygen ion etching process to partially cover the insulating layer; and forming a silicon oxide layer, by the oxygen ion etching process, on a surface of the insulating layer not covered by the second metal layer.

In an exemplary embodiment, the method includes a step of patterning the insulating layer to form a via hole.

In an exemplary embodiment, a portion of the second metal layer is electrically connected to a portion of the first metal layer through the via hole formed in the insulating layer.

In an exemplary embodiment, the array substrate includes a TFT array;

the first metal layer includes a source, a drain, a source line, and a drain line of the TFT array.

In an exemplary embodiment, the second metal layer includes a pixel electrode, and the drain line is electrically connected to the pixel electrode through a via hole formed in the insulating layer.

In an exemplary embodiment, the first metal layer further includes a first signal line, and the first signal line is electrically connected to the second metal layer through a via hole formed in the insulating layer.

In an exemplary embodiment, the first metal layer includes a touch signal line, the second metal layer includes a touch electrode, and the touch signal line is electrically connected to the touch electrode through a via hole formed in the insulating layer.

In an exemplary embodiment, the second metal layer includes a light shielding layer.

In an exemplary embodiment, the silicon-containing organic material is a silicon-containing polyimide or polydimethylsiloxane.

In an exemplary embodiment, the oxygen ion etching process is an oxygen plasma etching or an oxygen reaction ion etching.

In an exemplary embodiment, the array substrate is an OLED array substrate.

According to a second aspect of the present disclosure, an array substrate is provided, including:

a base substrate;

a first metal layer on the base substrate;

an insulating layer formed on the first metal layer; and a second metal layer partially formed on the insulating layer, wherein the insulating layer is formed of a silicon-containing photoresist, and a surface of the insulating layer not covered by the second metal layer is formed with a silicon oxide layer.

According to a third aspect of the present disclosure, there is provided a display device including the array substrate described above.

BRIEF DESCRIPTION OF THE DRAWINGS

Specific embodiments of the present disclosure will be further described in detail below with reference to the accompanying drawings.

DETAILED DESCRIPTION

Figure 1:
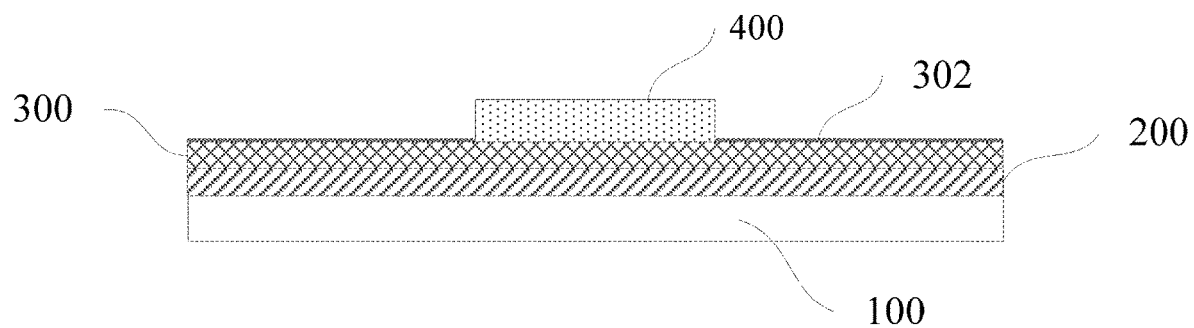
FIG. 1 is a schematic diagram illustrating an array substrate according to a first embodiment of the present disclosure.

In order to explain the present disclosure more clearly, the present disclosure will be further described below in conjunction with preferred embodiments and the accompanying drawings. Similar components in the drawings are denoted by the same reference numerals. It should be understood by those skilled in the art that the contents described in detail below are illustrative not restrictive, and are not intended to limit the protection scope of the present disclosure.

Terms "first", "second" and the like, in the specification and claims of the present disclosure and the above-mentioned drawings are used to distinguish different objects, instead of describing a specific order. Furthermore, terms "including", "having" and any variations thereof are intended to cover non-exclusive inclusions. For example, processes, methods, systems, products, or devices that include a series of steps or units are not limited to the listed steps or units, optionally, steps or units not listed, or other steps or units inherent to these processes, methods or devices are further included.

FIG. 1 is a schematic diagram illustrating an array substrate according to a first embodiment of the present disclosure. The array substrate of the present embodiment includes a base substrate 100; a first metal layer 200 formed on the base substrate; an insulating layer 300 formed on the first metal layer; and a second metal layer 400 formed on a portion of the insulating layer, wherein a portion of a surface of the insulating layer 300 is not covered by the second metal layer. The insulating layer 300 is made of a silicon-containing organic material, which may be formed by a silicon-containing photoresist as used in the present embodiment, and surfaces 302 of the insulating layer 300, which are not covered by the second metal layer, include a silicon oxide layer. The insulating layer is formed by the silicon-containing photoresist, and when the second metal layer is etched by adopting an oxygen ion etching process, oxygen ions will be reacted with silicon in the silicon-containing photoresist to form a silicon oxide layer as a protective layer, in this way, the insulating layer can be prevented from being etched away in the oxygen ion etching process.

The base substrate may be a substrate formed by one or more of a variety of materials such as a glass material, a metal material, or a plastic material (for example, polyethylene terephthalate (PET), polyethylene naphthalate (PEN), polyimide (PI)). The base substrate may include a TFT array formed on the substrate. The base substrate can be rigid or flexible. When the base substrate is flexible, the base substrate may be bendable or foldable.

In an exemplary embodiment, as the silicon-containing organic material, the silicon-containing photoresist may be used, which may be a photoresist material with a main chain containing silicon, a main chain of a silicon oxide bond, or containing silicon, such as silicon-containing polyimide or polydimethylsiloxane (PDMS)-based material. In an exemplary embodiment, silicon-containing polyimide may be used, which is an organic polymer material, and has excellent coverage and bendability, and wide range of application.

According to an example of the present disclosure, the array substrate includes a TFT array, and the first metal layer on the TFT array is a source/drain metal layer which includes a source, a drain, a source wiring, a drain wiring for forming the TFT array, and the second metal layer is a functional layer for forming a display panel or a display device. In an exemplary embodiment, the array substrate is used for a display device having a fingerprint recognition function, and the second metal layer may be a light shielding layer for the fingerprint recognition function. An insulating layer for insulation is formed between the source/drain metal layer and the light shielding layer. A portion of the insulating layer is not covered by the second metal layer and can be used for partial light transmission. By adopting the silicon-containing photoresist, the insulating layer is formed flatly between the source/drain metal layer and the light shielding layer, thereby forming a high-quality light shielding layer, this improves fingerprint recognition sensitivity of a touch panel and display quality of the display device.

Figure 2:
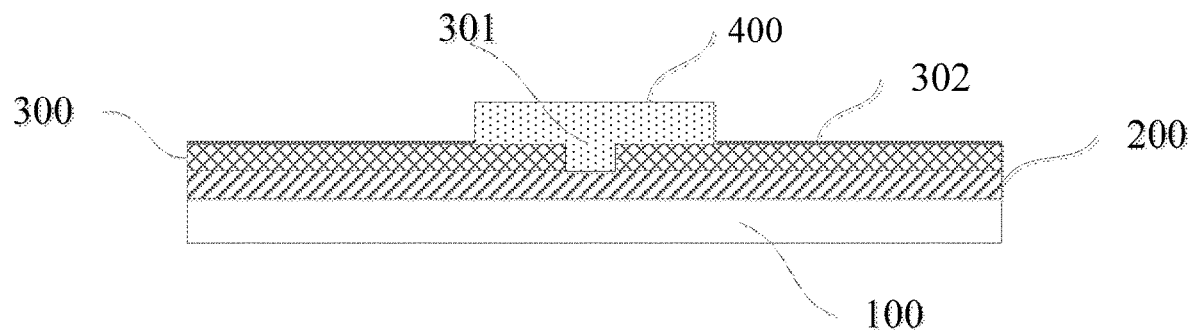
FIG. 2 is a schematic diagram illustrating an array substrate according to a second embodiment of the present disclosure.

FIG. 2 is a schematic diagram illustrating an array substrate according to a second embodiment of the present disclosure. The array substrate of the present embodiment includes a base substrate 100; a first metal layer 200 formed on the base substrate; an insulating layer 300 formed on the first metal layer; and a second metal layer 400 formed on a portion of the insulating layer, wherein a portion of a surface 302 of the insulating layer 300 is not covered by the second metal layer, and the second metal layer 400 is electrically connected to the first metal layer through a via hole 301 formed in the insulating layer. The insulating layer 300 is formed of a silicon-containing photoresist, and a silicon oxide layer is formed on the surface 302 of the insulating layer 300. In this embodiment, the array substrate includes a TFT array, and a first metal layer on the TFT array is a source/drain metal layer including a source, a drain, a source line, and a drain line for forming the TFT array.

According to an example of the present disclosure, the first metal layer on the array substrate is a source/drain metal layer including a source, a drain, a source line, and a drain line for the TFT array, the functional layer includes a pixel electrode, and a drain line formed in the source/drain metal layer is electrically connected to the pixel electrode through a via hole formed in the insulating layer. The insulating layer is formed of the silicon-containing photoresist and the insulating layer may be patterned by performing patterning for one time, this reduces process steps and decreases process costs and also prevents the multiple times of corrosions from affecting the underlying array of TFTs, and in the etching process in which the oxygen ions are used as an etchant, the silicon oxide layer is formed on the surface of the insulating layer, thereby increasing product quality and yield.

According to another example of the present disclosure, the array substrate includes a TFT array, and the first metal layer on the TFT array is a source/drain metal layer, which includes a source, a drain, a source line, and a drain line for forming the TFT array, the source/drain metal layer further includes a signal line that provides a corresponding signal to the second metal layer that serves as the functional layer. For example, the signal line is a touch signal line, and the second metal layer includes, for example, a touch electrode and a common electrode for forming a display panel having a touch function. The touch electrode and the common electrode are time-division multiplexed, so that the display panel can be used as both a touch substrate and a display substrate, thereby a pixel density and an integration degree of a display device are increased, and user experience is improved. The touch electrode and the touch signal line are electrically connected through a via hole formed in the insulating layer. The insulating layer is formed of the silicon-containing photoresist and the insulating layer may be patterned by performing patterning for one time, this reduces process steps and decreases process costs and also prevents the multiple times of corrosions from affecting the underlying array of TFTs, and in the etching process in which the oxygen ions are used as an etchant, the silicon oxide layer is formed on the surface of the insulating layer, thereby increasing product quality and yield.

It can be understood that functions of the first metal layer and the second metal layer in the present disclosure are not limited to the examples in the specific embodiments, and the present disclosure is also applicable for other two-layer metal layer structures in which no insulating layer is provided.

A method for fabricating an array substrate according to the present disclosure will be described in detail below with reference to FIGS. 3-7.

Figure 3:
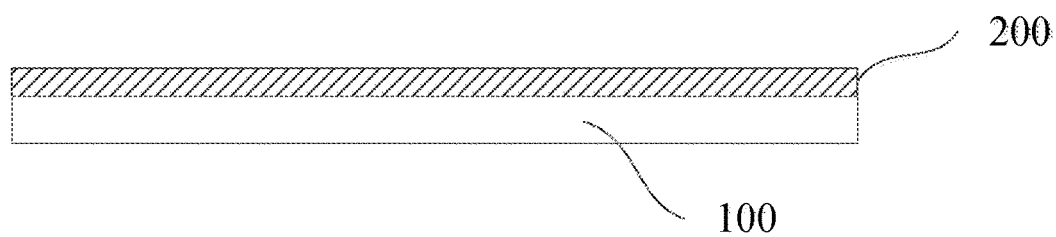
FIGS. 3-7 are flow charts showing a method for fabricating an array substrate according to the present disclosure.

As shown in FIG. 3, a base substrate 100 is provided, and a first metal layer 200 is formed on the base substrate.

The base substrate is, for example, a substrate on which a TFT array are formed, and the base substrate includes, for example, a substrate, a gate electrode, an active layer, and a gate insulating layer formed between the gate electrode and the active layer. The first metal layer is, for example, a metal layer for forming a source electrode, a drain electrode, a source line, and a drain line.

Figure 4:
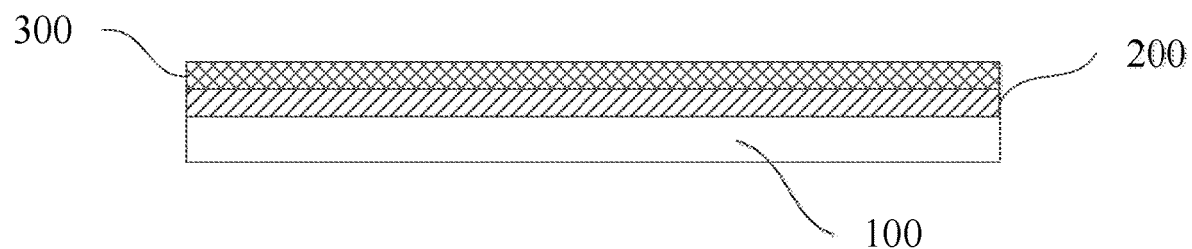

As shown in FIG. 4, an insulating layer 300 is formed on the first metal layer 200.

A silicon-containing polyimide is applied onto the first metal layer by spin coating or screen printing, for example, to form an insulating layer for insulation.

Figure 5:
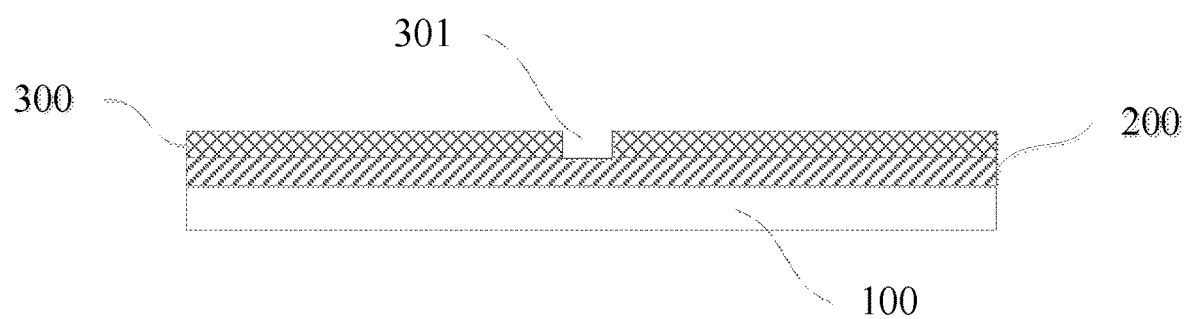

As shown in FIG. 5, the insulating layer is patterned to obtain an opening 301.

The insulating layer may be patterned as needed. The insulating layer, which is formed of the silicon-containing photoresist, is patterned by performing a photolithography process for one time. Compared with an insulating layer which is formed of an inorganic material, such as, silicon oxide or silicon carbide, and processes of the insulating layer, steps of pattern transfer and photoresist lift off are reduced, thus the product quality and yield can be improved.

Figure 6:
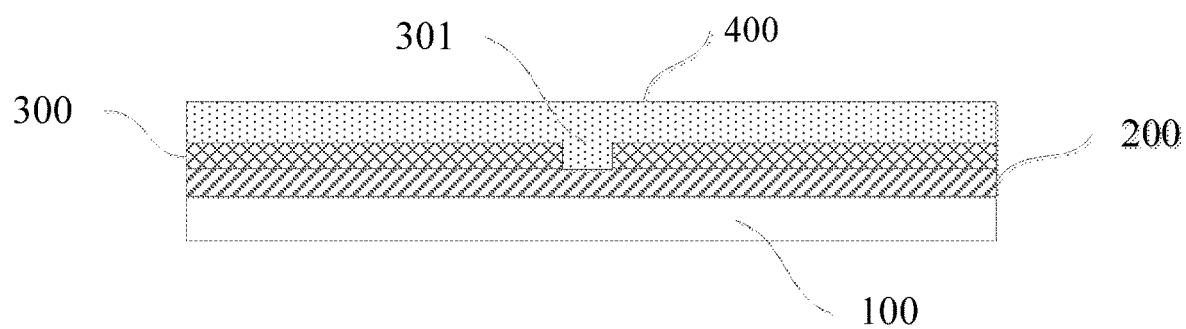

As shown in FIG. 6, a second metal layer 400 is formed on the patterned insulating layer 300. The second metal layer is electrically connected to the first metal layer through a via hole formed in the insulating layer.

Figure 7:
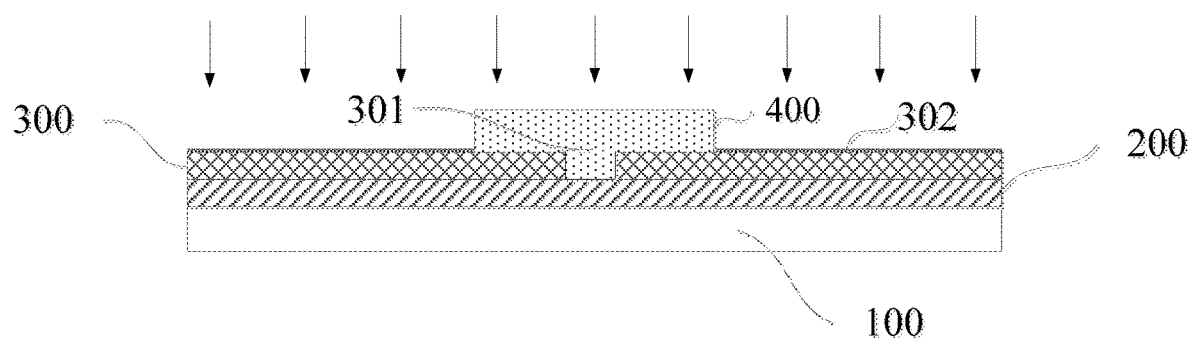

As shown in FIG. 7, the second metal layer is patterned by adopting an oxygen ion etching process to obtain an array substrate in which the insulating layer is partially covered by the second metal layer.

The step of patterning the second metal layer includes, for example, deposition or chemical vapor deposition of metal on the patterned insulating layer to obtain the second metal layer. A second photoresist is applied onto the obtained second metal layer, and the second photoresist is patterned to obtain a patterned photoresist layer. Then, the patterned photoresist layer is used as a mask, the second metal layer is patterned by employing an oxygen ion etching method, for example, an oxygen ion plasma etching or oxygen ion reaction ion etching method, to obtain the second metal layer that partially covers the insulating layer and a surface 302 of the insulating layer not covered by the second metal layer. The oxygen ions are reacted with the insulating layer exposed to the second metal layer to form a silicon oxide layer on the surface.

The silicon-containing photoresist is used as the insulating layer between the first metal layer and the second metal layer, on one hand, the silicon-containing photoresist is used as a structure layer in the array substrate, which simplifies patterning processes of the insulating layer, on the other hand, in the patterning processes in which the second metal layer is etched with the oxygen ions, the silicon-containing photoresist is reacted with the oxygen ions on the surface thereof to form a silicon oxide layer to prevent further corrosion of the photoresist by the oxygen ions, in this way, the insulating layer with a complete structure and a flat surface can be obtained, and product performance and quality are improved.

According to an example of the present disclosure, the insulating layer may be formed between the first metal layer and the second metal layer without performing the patterning processes, and it is not necessary to form a via hole in the insulating layer. This example can be applied to a display device in which a second metal layer is used as a light shielding layer.

It is apparent that the above-described embodiments of the present disclosure are merely examples provided for clearly describing the present disclosure and are not intended to limit the embodiments of the present disclosure. Those skilled in the art can also make different forms of changes and modifications on the basis of the foregoing descriptions, and all of the embodiments are not exhaustive herein. Obvious changes or modifications which are included in the technical solutions of the present disclosure shall fall into the protection scope of the present disclosure.

What is claimed is:

1. A method for fabricating an array substrate, comprising:
    forming a first metal layer on a base substrate;
    forming an insulating layer of a silicon-containing organic material on the first metal layer;
    forming a second metal layer on the insulating layer;
    patterning the second metal layer by adopting an oxygen ion etching process to partially cover the insulating layer; and
    forming a silicon oxide layer, by the oxygen ion etching process, on a surface of the insulating layer not covered by the second metal layer.

2. The method for fabricating an array substrate according to claim 1, wherein the insulating layer is patterned to form a via hole after the insulating layer is formed.

3. The method for fabricating an array substrate according to claim 2, wherein a portion of the second metal layer is electrically connected to a portion of the first metal layer through the via hole formed in the insulating layer.

4. The method for fabricating an array substrate according to claim 1, wherein the array substrate comprises a TFT array; and
    the first metal layer comprises a source, a drain, a source line, and a drain line of the TFT array.

5. The method for fabricating an array substrate according to claim 4, wherein the second metal layer comprises a pixel electrode, and the drain line is electrically connected to the pixel electrode through a via hole formed in the insulating layer.

6. The method for fabricating an array substrate according to claim 1, wherein the first metal layer further comprises a first signal line, and the first signal line is electrically connected to the second metal layer through a via hole formed in the insulating layer.

7. The method for fabricating an array substrate according to claim 1, wherein the first metal layer comprises a touch signal line, the second metal layer comprises a touch electrode, and the touch signal line is electrically connected to the touch electrode through a via hole formed in the insulating layer.

8. The method for fabricating an array substrate according to claim 1, wherein the second metal layer comprises a light shielding layer.

9. The method for fabricating an array substrate according to claim 1, wherein the silicon-containing organic material is a silicon-containing polyimide or polydimethylsiloxane.

10. The method for fabricating an array substrate according to claim 1, wherein the oxygen ion etching process is an oxygen plasma etching or an oxygen reaction ion etching.

11. The method for fabricating an array substrate according to claim 1, wherein the array substrate is an OLED array substrate.

* * * * *